United States Patent [19]

Harrison et al.

[11] Patent Number: 4,901,006
[45] Date of Patent: Feb. 13, 1990

[54] METHOD AND APPARATUS FOR AC SIGNAL COMPARISON, CALIBRATION AND MEASUREMENT

[75] Inventors: Archie J. Harrison Jr., Mount Arlington; Fred L. Katzmann, Cedar Grove, both of N.J.

[73] Assignee: Electro Scientific Industries, Inc., Portland, Oreg.

[21] Appl. No.: 374,607

[22] Filed: Jun. 29, 1989

Related U.S. Application Data

[63] Continuation of Ser. No. 99,232, Sep. 21, 1987, abandoned, which is a continuation-in-part of Ser. No. 92,154, Sep. 2, 1987, abandoned, which is a continuation of Ser. No. 761,609, Aug. 1, 1985, abandoned, which is a continuation-in-part of Ser. No. 580,450, Feb. 15, 1984, Pat. No. 4,695,793.

[51] Int. Cl.$^4$ .............................. G01R 5/22; H01V 1/32
[52] U.S. Cl. .................................... 324/106; 136/207; 324/132
[58] Field of Search .................... 324/95, 106, 132; 338/22, 23, 24, 25; 363/13; 136/207, 223

[56] References Cited

U.S. PATENT DOCUMENTS

| | | | |
|---|---|---|---|
| 1,121,835 | 12/1914 | Hiatt | 363/13 |
| 1,662,889 | 3/1928 | Hubbard | 136/207 |
| 1,765,563 | 6/1930 | Borden et al. | 136/207 |
| 1,862,014 | 6/1932 | Grondahl . | |
| 2,031,480 | 2/1936 | Hamada . | |
| 2,178,548 | 11/1939 | Black et al. . | |
| 2,413,021 | 12/1946 | Wolfson et al. . | |
| 2,463,805 | 3/1949 | Polye et al. . | |
| 2,496,541 | 2/1950 | Johnson, Jr. . | |
| 2,545,390 | 3/1951 | Spahn . | |
| 2,577,111 | 12/1951 | Downing, Jr. et al. | 363/13 |
| 3,052,846 | 9/1962 | Hill . | |
| 3,267,376 | 8/1966 | Harries . | |
| 3,435,319 | 3/1969 | Richman | 324/106 |
| 3,488,573 | 1/1970 | Cavigelli . | |
| 3,521,164 | 7/1970 | Richman . | |
| 3,597,685 | 8/1971 | Ford . | |
| 3,609,541 | 9/1971 | Scott, Jr. . | |
| 3,689,824 | 9/1972 | Malcolm . | |
| 3,705,365 | 12/1972 | Szabo . | |
| 3,723,845 | 3/1973 | Duckworth . | |
| 4,370,546 | 1/1983 | Warner . | |
| 4,695,793 | 9/1987 | Katzmann . | |

FOREIGN PATENT DOCUMENTS

| | | |
|---|---|---|
| 113784 | 8/1941 | Australia . |
| 204837 | 11/1956 | Australia . |
| 26691 | 1/1905 | United Kingdom ................ 136/207 |

OTHER PUBLICATIONS

Hermach, Francis L., "Thermal Converters as AC-DC Transfer Standards for Current and Voltage Measurements at Audio Frequencies", Journal of Research of the National Bureau of Standards, vol. 48, No. 2, Feb. 1952.

Richman, Peter L., "A New Wideband True Rms-to-DC Converter", IEEE Transactions on Instrumentation and Measurement, p. 129 (Jun. 1967).

*Primary Examiner*—Ernest F. Karlsen
*Attorney, Agent, or Firm*—Stoel Rives Boley Jones & Grey

[57] ABSTRACT

A method and apparatus for the comparision of AC signals by electrothermal means in which both signals are applied to an electrothermal converter, such as a thermocouple converter or a thermoresistive converter, and the temperature produced by the signals is converted to a difference signal. The DC component of the difference signal is used to maintain the electrothermal converter at a stable operating temperature. The AC component of the difference signal is used to indicate the difference between two signals when used as a comparator, to control the amplitude of a reference standard's output when used as a voltmeter or calibration standard, and also to control the amplitude of an oscillator when used as a calibration standard.

11 Claims, 6 Drawing Sheets

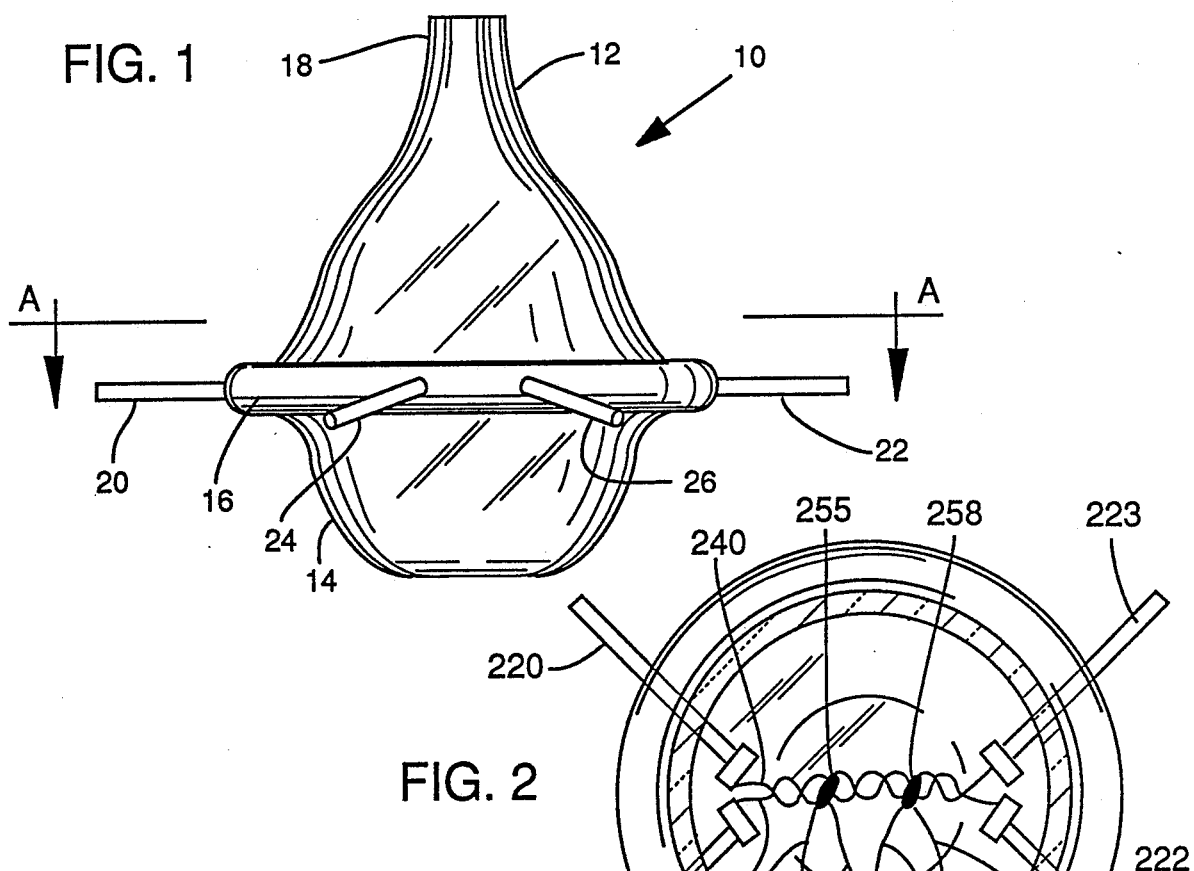
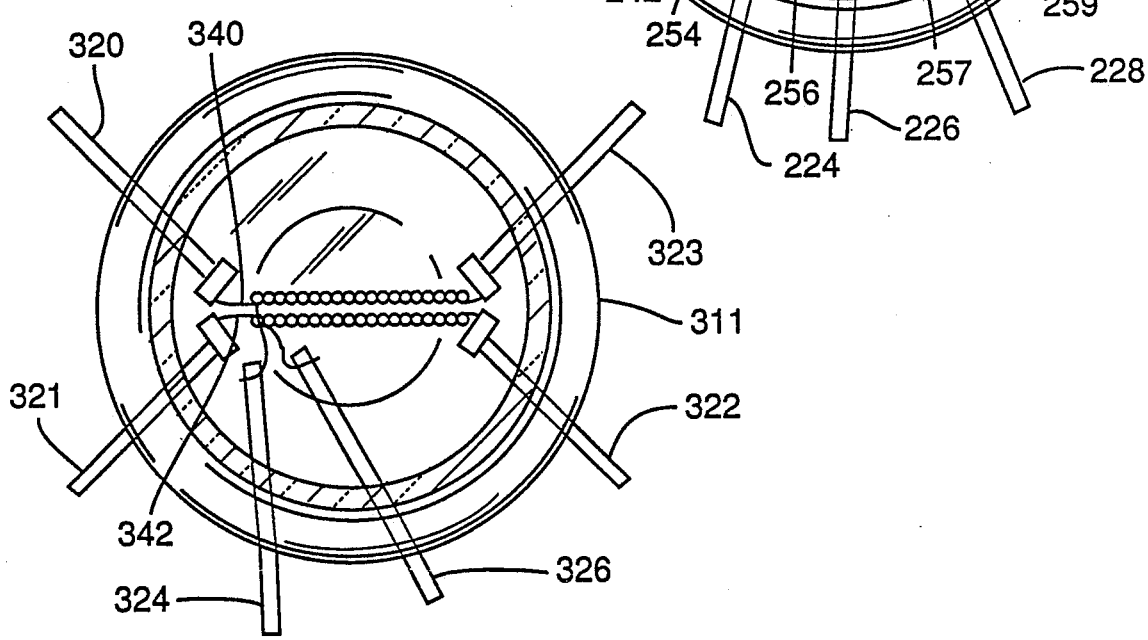

METHOD AND APPARATUS FOR AC SIGNAL COMPARISON, CALIBRATION AND MEASUREMENT

RELATED CASES

This is a continuation of application Ser. No. 07/099,232, filed Sept. 21, 1987, now abandoned, which is a continuation-in-part of co-pending Ser. No. 092,154, filed Sept. 2, 1987, now abandoned, which is a continuation of Ser. No. 761,609, filed Aug. 1, 1985, now abandoned, which is a continuation-in-part of copending Ser. No. 580,450, filed Feb. 15, 1984 now U.S. Pat. No. 4,695,793.

FIELD OF THE INVENTION

Our invention relates to electrothermal conversion method and apparatus for comparing, calibrating and measuring AC signals by electrothermal conversion, in particular, to more rapid methods and apparatus for accomplishing such conversions. Our invention further relates to AC comparison, calibration and measurement methods and apparatus utilizing such electrothermal conversion methods and apparatus.

BACKGROUND OF THE INVENTION

Measurement and calibration of AC signals is much more difficult than in the case of DC. One technique is to apply the AC signal to a heater element adjacent to or contacting a temperature sensor such as a bimetallic junction thermocouple, which comprises two wires that are joined at both ends. According to the Seebeck effect, heating one such junction will induce a current in the wires. (In practice, a very high impedance device typically is interposed in the circuit of the two wires so that current flow is negligible). The joule heating in the heater, caused by the AC signal, induces a voltage in the thermocouple. This thermocouple voltage is proportional to the temperature difference between the bimetallic junction adjacent to the heater element and the cold junction temperature.

In one type of known method for measurement of AC voltages, the unknown AC signal and an easily measureable DC signal are separately applied to a heater associated with a electrothermal sensor, such as a thermocouple. First, when the AC signal is connected to the heater, the thermocouple voltage is nulled to a stable voltage source by adjustment of a potentiometer, which is adjusted to apply an equal and opposite voltage to that generated by the thermocouple. Then, without changing the potentiometer setting, an easily measured DC voltage is substituted for the AC signal applied to the heater element, which again induces a voltage in the thermocouple. The DC voltage amplitude is increased until the voltage generated by the thermocouple is again equal and opposite to the voltage previously set by the potentiometer during the AC measuring phase. When this null condition is reached, the amplitude of the DC voltage is measured. This DC amplitude is thereby equal to the RMS amplitude value of the AC signal.

Various methods and apparatus for AC signal measurement or calibration to a thermocouple are disclosed in U.S. Pat. No. 3,723,845 of James J. Duckworth, entitled "True RMS to DC Converters," issued on Mar. 27, 1973 and assigned to the assignee of this application; U.S. Pat. No. 4,659,910 of Arthur J. Harrison, Jr. et al., entitled "AC-DC Transfer Standard Temperature Sensor Reversal Error Compensation Circuit" and copending Ser. No. 580,450, now U.S. Pat. No. 4,695,793, assigned to the assignee of this application.

SUMMARY OF THE INVENTION

In accordance with the present invention, the same thermal sensing means are used to determine the temperature produced in a heater as a result of two signals. The thermal sensing means and heater are maintained in a fairly narrow temperature range during the measurement process. In embodiments described below, this is accomplished by use of two heaters in thermal contact each connected to a separate signal and by having the thermal sensor sense the temperature produced by both heaters, producing a difference signal. In the embodiments described below, the DC component of the difference signal is used to maintain the electrothermal converter at a stable operating temperature. When this apparatus is incorporated in a comparison circuit, the AC component of the difference signal is used to indicate the difference between two signals to be compared. When this apparatus is used in a voltmeter circuit, the AC component of the difference signal is used to control the amplitude of a reference standard's output. When this apparatus is used in a AC voltage calibration circuit, the AC component of the difference signal is used to control the amplitude of a reference standard's output and also to control the amplitude of an oscillator. The exemplary embodiments of the present invention described below include a precision AC voltmeter and apparatus for producing a calibrated AC signal.

BRIEF DESCRIPTION OF THE DRAWINGS

FIG. 1 is an elevation of a UHF pattern glass vacuum enclosure used for electrothermal converters.

FIG. 2 is a plan view of a thermocouple type electrothermal converter, shown in a UHF pattern enclosure along line AA of FIG. 1.

FIG. 3 is a plan view of a first thermoresistive type electrothermal converter, shown in a UHF pattern enclosure along line AA of FIG. 1.

DETAILED DESCRIPTION

Figure 4:
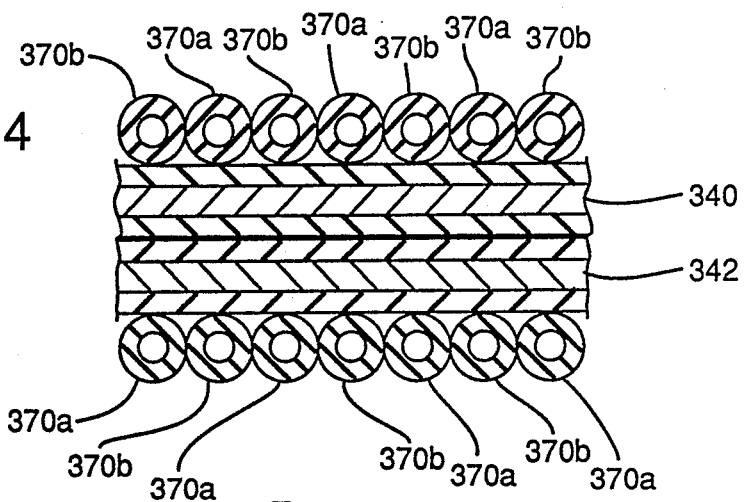
FIG. 4 is a cross-section of a portion of the heater wires and sensing wire of the converter of FIG. 3.

We first briefly describe electrothermal converter devices suitable for use in accordance with the method and apparatus of our invention. This will be followed by specific embodiments including circuits in accordance with our invention.

FIG. 1 shows a typical UHF pattern glass vacuum enclosure 10, of the known type, which is preferred for the converters of our invention when high frequencies are employed. It comprises a funnel-shaped section 12 and a dish-shaped section 14 which have been joined at a seal 16. Leads 20, 22, 24, 26, etc. protrude radially through the seal 16. The enclosure 10 is evacuated through the small end 18 of the funnel-shaped section 12.

At lower frequencies, other conventional vacuum enclosures may be used.

FIG. 2 shows a electrothermal converter 211 of the thermocouple type which is housed in a UHF pattern enclosure 10 as shown in FIG. 1. The electrothermal converter 211 comprises a pair of heater wires 240, 242, supported and electrically connected at their ends by leads 220-223. We prefer to twist the heater wires 240, 242 sufficiently to maintain thermal contact; however, they are electrically insulated from each other. At two points equally spaced either side of the center of the heater wires 240, 242 are two thermocouple junctions 255, 258. These are formed in each case by the junctions adjacent the heater wires 240, 242, of the wires 254 and 256 at junction 255, and of the wires 257 and 259 at junction 258. Wires 254 and 256 are supported and electrically connected at their ends by leads 224 and 226 respectively. Wires 257 and 258 are likewise supported and electrically connected at their ends by leads 226 and 228 respectively. There also may be a junction of wires 156 and 257 where they meet lead 226 (or there are junctions of each of those wires with lead 226), however, this junction is relatively remote from and unaffected by the heaters 240, 242.

In this embodiment, heater wires 240 and 242 each have an electrical resistance of about 90 ohms and are made of a material having a low temperature coefficient of resistivity, on the order of 10 ppm/°C. or less. For circuits where the current developed through heater wires 240, 242 are approximately 1-10 mA, heater wires 240, 242 are presently made of 0.0005 inch diameter Evenohm brand wire with DuPont type PyrML insulation. Stablohm 800 or H-ML wire can also be used for heater wires 240, 242.

Each of the thermocouples formed at junctions 255, 258 by the wires 254, 256 and 257, 259, are formed by junctions of two kinds of wires. A small quantity of conventional thermocouple insulating material is placed at the junctions 255, 258 to adhere them to the heater wires 240, 242.

Further information concerning details of the construction of electrothermal converters, which can be used in the various converters of this invention, are described in application Ser. No. 580,450, filed Feb. 15, 1984 and assigned to the assignee of this application, the contents of which are hereby incorporated by reference.

FIG. 3 shows a thermoresistive electrothermal converter 311. Thermoresistive converter 311 comprises a first heater wire 340, a second heater wire 342 and a sensing wire 370. Heater wires 340, 342, each have an electrical resistance of about 90 ohm and are made of a material having a low temperature coefficient of resistivity, on the order of 10 ppm/°C. or less. For circuits where the current developed through heater wires 340, 342 are approximately 1-10 mA, heater wires 340, 342 are presently made of 0.0005 inch diameter Stablohm brand type H-ML high temperature enamel insulated wire made by California Fine Wire Company, Grover City, Calif. This particular type of wire has a temperature coefficient of resistivity of +10 ppm/°C. and a resistance of 3,192 ohms/foot. This provides a 90 ohm resistance for a 8.6 mm heater length, or a 220 ohms/-volt characteristic sensitivity at a nominal 5 mA device working current. It is also possible to use Stablohm 800 for heater wires 30 and 40, which has a temperature L-coefficient of resistivity of +5 ppm/°C.

Sensing wire 370 is a fine, electrically insulated wire having a relatively high temperature coefficient of resistivity. Sensing wire 370 can be made of 0.0005 inch diameter, Nickel 272 wire made by California Fine Wire Company, which has a temperature coefficient of resistivity of +6536 ppm/°C. and an electrical resistance of 188 ohms/foot. Platinum wire or high purity nickel wire can also be used for sensing wire 370.

Figure 5:
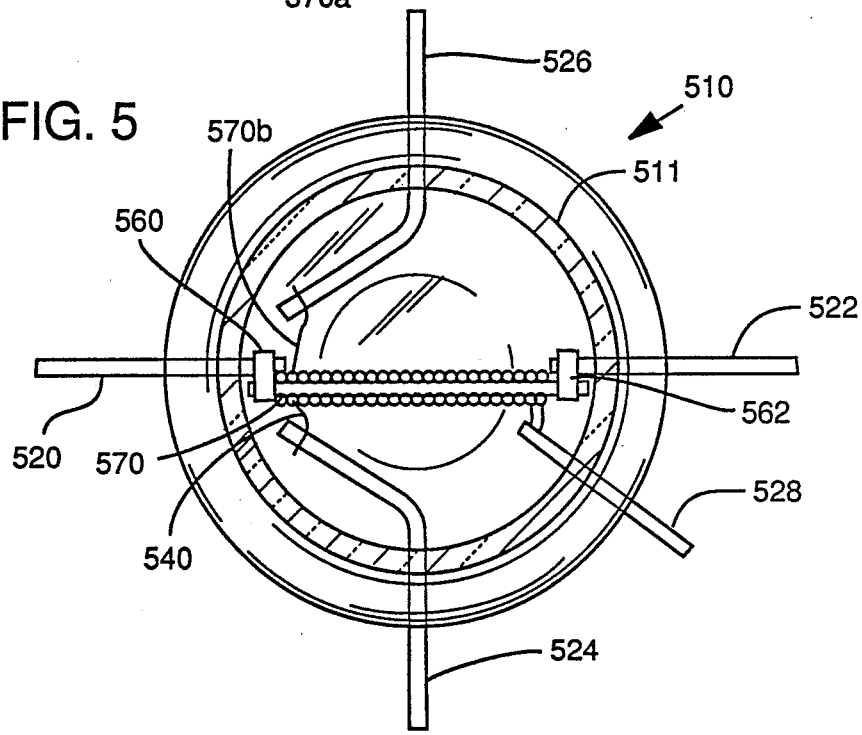
FIG. 5 is a plan view of a second thermoresistive type electrothermal converter, shown in a UHF pattern enclosure along line AA of FIG. 1.
Figure 6:
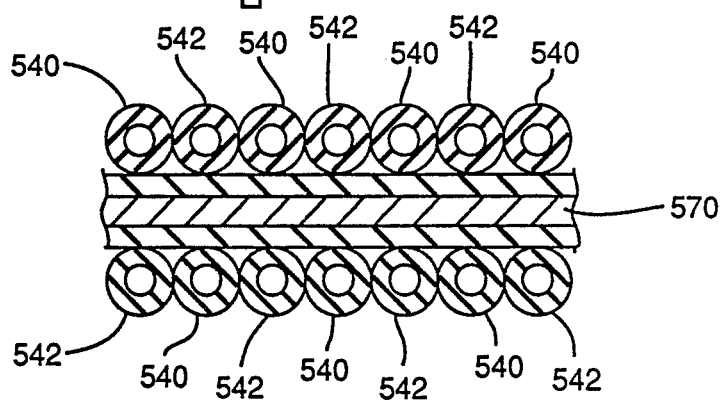
FIG. 6 is a cross-section of a portion of the heater wires and sensing wire of the converter of FIG. 5.

Heater wires 340, 342, and sensing wire 370 should be in thermal contact such that the temperature of sensing wire 370 will be related to the rate of thermal energy generation by, and the temperatures of, heater wires 340, 342. Specifically, heater wires 340, 342 can be placed in parallel contact with sensing wire 50 wrapped around them as shown in FIG. 3, preferably with a slight twist in the heater wires 340, 342, as was the case with heater wires 240, 242 of FIG. 2. Another means for achieving adequate thermal contact is to twist together heater wire 30, heater wire 40 and sensing wire 50. Yet another means is first to twist together heater wires 30 and 40, and then wrap sensing wire 50 around them. Still another arrangement is shown in FIGS. 5 and 6, discussed below. The heater wires 340, 342 and sensing wire 370 are supported and electrically connected by the leads 320-326 in the same fashion as described with respect to FIG. 2.

The use of low temperature coefficient of resistivity material for heater wires 340, 342 provides a more nearly linear relationship between the current in each heater wire and the temperature of the wire, because the resistance of each wire changes only a small amount with temperature. The use of a high temperature coefficient of resistivity material for sensing wire 370 provides a relatively large change in its resistance for a small change in the temperature of either heater wire 340, 342, thereby providing relatively great sensitivity for measurements based upon changes in the electrical resistance of sensing wire 370.

To reduce the adverse effects of induced currents in sensing wire 370, it preferably is wound in a bucking configuration, with half of the sensing wire 370a twisted in one direction about heater wires 340, 342, and the other half of sensing wire 370b twisted in the opposite direction. This will cause the currents in sensing wire 370 that are induced by the currents in heater wires 340, 342 to cancel out. One way of accomplishing this is to twist sensing wire 370 about heater wires 340, 342 by first forming sensing wire 370 into a hairpin shape, holding the "U" of sensing wire 50 at the centers of heater wires 340, 342, and then twisting the wires together in the same direction for the same number of turns. This results in sensing wire 50 having half its windings twisted in a direction opposite to those in the other half. Alternatively, a bucking configuration can be obtained by twisting two adjacent wires together with heater wires 340, 342, and joining these adjacent wires together at one end to form sensing wire 370. While it is possible to connect outside of vacuum enclosure 310 the wires to achieve a bifilar winding in sensing wire 370, it is preferred to join the two parts of the sensing wire to a single supporting wire inside vacuum enclosure 310 (not shown), or to join them without a supporting wire, or to form sensing wire 370 from a single length of wire in the shape of a hairpin before twisting it together with heater wires 340, 342.

FIG. 4 is a cross section of a portion of the heater wires 340, 342 and sensing wire 370 of FIG. 3.

FIG. 5 shows an alternative thermoresistive converter 511 to that of FIGS. 3 and 4. Converter 511 has the heater wires 540, 542 wrapped around the sensing wire 570, but otherwise operates in a fashion similar to the converter 311 of FIGS. 3 and 4.

FIG. 6 is a cross-section of a portion of the heater wires 540, 542, and sensing wire 570 of FIG. 5.

Figure 7:
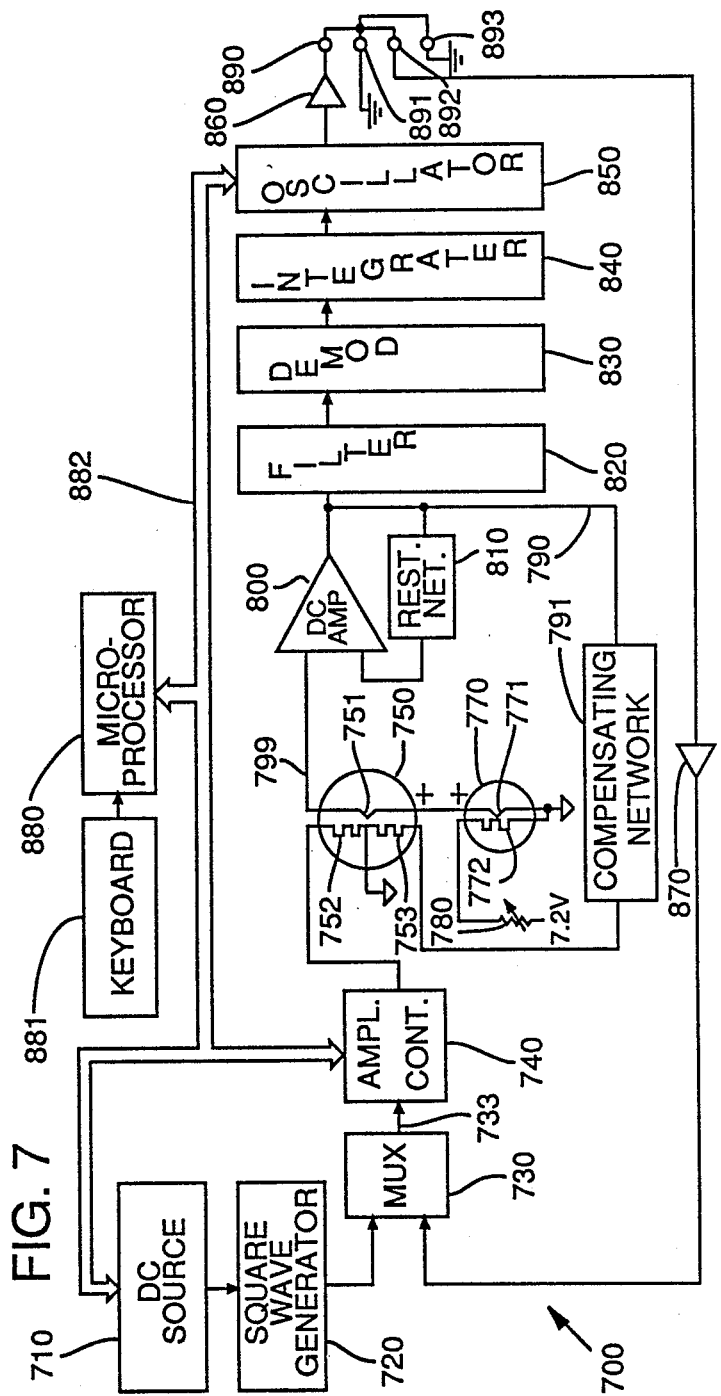
FIG. 7 is a block diagram of an AC voltage calibration standard in accordance with our invention.

FIG. 7 is a block diagram of an AC voltage calibration standard 700 in accordance with our invention. This embodiment generates an accurate and stable AC voltage standard by comparing the RMS value of the signal produced by the standard with the RMS value of a reference signal which is generated from a microprocessor controlled precision DC voltage source and then correcting the amplitude of the AC voltage standard for any variations found.

The AC voltage standard is produced at the output terminals 890, 891 by the oscillator 850 and the output amplifier 860. The output terminals 890, 891 are connected to the sense terminals 892, 893 of the calibration standard 700 either at the front panel of the calibration standard 700 or at the end of a cable. The signal at the sense terminals 892, 893 is compared with a signal derived from a stable DC standard to control the output at terminals 890, 891.

A precision DC voltage source 710 described in greater detail in connection with FIG. 8 below, and a square wave generator 720 are used to generate the reference signal with which the AC voltage standard is compared. The DC voltage source 710 has an amplitude range of 0.1 to 2.0 volts, which is set by the microprocessor 880 in response to the desired AC output amplitude which is entered via a keyboard 881. The desired frequency, between 10 Hz and 1MHz in this embodiment, is also entered via the keyboard 881, and the necessary frequency information is transmitted by the microprocessor 880 to the oscillator 850. The microprocessor 880 also controls the amplification or gain range of the amplitude control circuit 740 as further described below.

The square wave generator 720 uses the output of the voltage source 710 to generate the reference signal which is a square wave which oscillates at 500 Hz with an amplitude plus or minus the output of the DC voltage source 710. This reference signal is connected to an input of the multiplexer 730.

The multiplexer 730 switches between the reference signal generated by the square wave generator 720 and the AC voltage standard, which is fed back from its output at terminals 890 and 891 through buffer 870 to the other input of multiplexer 730. This combines these two signals in a time multiplexing fashion. The rate of switching is 2 Hz. As a result, the signal at the multiplexer output 733 consists of alternating periods of 250 ms of the reference signal followed by 250 ms of the AC voltage standard. The output of the multiplexer 730 is connected to amplitude control circuit 740, which provides buffering, amplification and attenuation as needed to keep the thermoelectric converter 750 within its optimum operating range. This is done under control of microprocessor 880. Under overload conditions, the amplitude control circuit 740 also clamps its output at +2.1 volts to protect the thermoelectric converter 750 in the next stage.

The next stage consists of two thermoelectric converters 750 and 770. The first thermoelectric converter 750 consists of two heater wires 752 and 753 and a thermocouple sensor 751 of the type discussed above in connection with FIG. 2; however, this invention is not limited to thermoelectric converters with two thermocouple junctions or with thermocouple type sensors. Thermocouple converters with a greater or lesser number of junctions can be used. Thermoresistive sensors of the type discussed above and shown in FIGS. 3-6 above, and further discussed in U.S. Pat. No. 4,695,793 can also be used in series with a power source. The multiplexer output signal, consisting of 250 ms of the 500 Hz. reference signal followed by 250 ms of the fed back AC voltage standard signal is connected to the first heater 752. The heater wires generate an amount of heat that is related to the RMS value of the current from the AC signal and the reference signal. The sensor 751 detects the resulting temperature and convert it to electricity so that a voltage will be generated across the sensor 751. The typical output of sensor 751 at its normal operating point is 4.5 mV in this embodiment. Thermoresistive sensors of the type disclosed in U.S. Pat. No. 4,695,793 may also be used.

The second thermoelectric converter 770 is provided to set the operating point on wire 799 as an input to DC Amplifier 800. It comprises a heater wire 772 and a sensor 771, substantially similar in design to the first converter 750; however, the second heater wire is not required for converter 770 and may be omitted. The sensor 771 generates a voltage relative to the amount of heat generated in the heater wire 772. This heater wire 772 is driven by a current generated by a 7.2 V reference driving a variable resistor 780. The variable resister 780 is adjusted until the sensor 771 is generating 4.5 mV across its terminals, biasing the first thermoelectric converter 750 at 4.5 mV. The two thermoelectric converters 750 and 770 are arranged in a series bucking manner, so that the 4.5 mV bias will be canceled by any voltage generated by the first thermoelectric converter 750 at the operating point on wire 799.

This calibration standard 700 has a stable operating point at wire 799, keeping the first thermoelectric converter 750 within its optimum region and maintaining the converter at a fairly stable temperature thus avoiding the errors and delays caused by operating at different temperatures, and by heating and cooling. This is achieved by means of a D.C. amplifier 800 and the feedback circuit along wire 790 that feeds the second heater wire 753 of the first thermoelectric converter 750. To see how that stable operating point is achieved, assume that all current from the multiplexer 730 that drives the first heater wire 752 is switched off. The sensor 751 would not generate any voltage as a result of heater wire 752 and the operating point will be biased at 4.5 mV by the second thermoelectric converter 770. This 4.5 mV is input to the positive terminal of a DC amplifier 800. The output of the DC amplifier is fed back through a resistive network 810 to the negative input of the DC amplifier 800. This amplifier 800 will output the difference of its positive and negative terminals. The 4.5 mV biasing voltage on wire 799 will cause a voltage on wire 790 from the DC amplifier 800. This voltage is fed through the network 791, which functions to speed up the response of the first thermoelectric converter 750 by increasing the rise time of the DC amplifier 800 output, to the second heater wire 753. Since we have assumed that there is no current to the first heater wire 752, only heat from the second heater wire 753 due to the feedback circuit 790 will contribute to the voltage generated by the sensor 751. As the sensor 751 starts to generate voltage, that voltage begins to cancel the 4.5 mV bias at wire 799 from the second thermoelectric converter 770, driving the voltage on wire 799 toward its stable operating point.

When the circuit is generating an AC voltage standard signal, the multiplexer 730 generates the multiplexed signal consisting of the reference square wave and the fed-back AC standard. This signal is fed to the first heater wire 752 of the first thermoelectric converter 750. The feedback circuit 790 driven by the DC amplifier 800 causes this circuit to be operated at a stable operating point. When the multiplexed signal is applied, the reference square wave, generated from a precision DC source 710 and square wave generator 720, will drive the first heater wire 752 for 250 ms. and generate an amount of heat relative to the RMS current from the reference signal. The sensor 751 will generate a voltage in response to the heat, which will cancel the biasing voltage of 4.5 mV driving the voltage at wire 799 closer to its stable operating point. If the reference signal generates enough current to cause the sensor 751 to generate 4.5 mV, the biasing voltage will completely cancel out and the operating voltage would be 0 volts. In this case the DC amplifier 800 will amplify the voltage difference across its terminals, which will be 0 volts, and provide no feedback to heat the second heater wire 753. In this case, the circuit will stay at its stable operating point without any feedback current along wire 790.

If, however, the sensor 751 does not generate 4.5 mV in response to the reference signal driving the first heater wire 752, there will be a DC voltage difference across the terminals of the DC amplifier 800. The DC amplifier 800 will amplify the voltage difference and feed the current generated back through network 791 into the second heater wire 753. The feedback current drives the second heater wire 753, which contributes to the heat generated by the first heater wire 752, causing an increase in the voltage generated by the sensor 751. This drives the operating voltage on wire 799 towards its stable point. The feedback continues until the stable point is reached. If the AC signal supplies too much current, then the feedback circuit 790 operates in the same fashion to reduce the current in the second heater wire 553 to bring the operating point at wire 799 to its stable operating voltage.

After the reference square wave has been applied for 250 ms, the AC voltage standard is then multiplexed into the first heater wire 752 for 250 ms. The thermoelectric converter function continues, whereby this signal heats the first heater wire 752 and the sensor 751 responds with a voltage corresponding to the RMS current in the AC voltage standard signal. In a similar fashion to the above discussion, the voltage generated by the sensor 751 cancels the biasing voltage of 4.5 mV generated by the second thermoelectric converter 770, to establish a voltage on wire 799. The DC amplifier 800 has previously established a stable operating point on wire 799 in response to the reference squarewave. If the RMS value of the AC voltage standard differs from the RMS value of the reference signal, the first thermoelectric converter 750 will generate a voltage different than the voltage generated for the reference squarewave and thereby change the voltage on wire 799. The DC amplifier 800 responds to this difference across its inputs to generate feedback to the second heater wire 753 to drive the voltage at wire 799 back to its stable operating point.

The output of the DC amplifier 800 is an error signal that represents the RMS difference between the AC voltage standard and the reference squarewave. Since the reference square wave is generated from a precision DC source 710, the reference should be very precise and accurate. This provides an accurate reference against which the fed back AC voltage standard is continually measured to check for stability and accuracy, and provides a correction for changes, for example, due to temperature fluxuations or loading effects upon the output amplifier 860. If the error signal is 0 volts, then the RMS value of the AC standard is equal to the RMS value of the 500 Hz reference squarewave and no corrections need be made. If the error signal is more negative than 0 volts, then the amplitude of the AC voltage standard must be lowered. If the error signal is more positive than 0 volts, then the amplitude of the AC voltage standard must be raised.

The DC amplifier 800 that drives the feedback circuit 790, also drives a high pass filter network 820 with the 2 Hz AC error signal component. This network 820 AC couples the error signal to the synchronous demodulator 830, which processes the AC error signal. The network 820 blocks the DC information contained in the error signal, so that DC offsets and drifts introduced by the electronics do not contribute to the error signal.

The output of filter 820 is connected to a synchronous demodulator 830. If the AC error signal component is 0 volts, indicating the AC voltage standard amplitude is correct and needs no correction, the output of the demodulator 830 is 0 volts. If there is an error signal at the output of filter 820, however, it will be an AC signal only, because of the AC coupling in the filter 800. The demodulator 830 converts the AC error signal component into a pulsating DC signal, which is not of a constant value.

The integrator 840 integrates the pulsating DC signal from the demodulator 830 over the entire period consisting of the 250 ms of reference square wave and then 250 ms of the AC voltage standard to output a DC error signal. The output of the integrator 840 produces a ramp, which drives an oscillator 850. If there is no error signal then the oscillator 850 does not adjust the amplitude of the AC voltage standard. If, however, there is an error signal, oscillator 850 adjusts the amplitude of the AC voltage standard in accordance with the polarity of the error signal. The AC voltage standard as produced by the oscillator 850, is driven by output amplifier 860 and is available at output terminals 890 and 891. It is also fed back to the multiplexer 730 through buffer amplifier 870 for continued comparison and corrections to its voltage amplitude as needed.

The microprocessor 880 is connected to a keyboard 881, which is located on the front panel of the AC voltage calibration standard 700. The microprocessor 880 receives instructions as to the desired amplitude and frequency from the keyboard 881 and then controls the AC voltage calibration standard 700 in accordance with these instructions over a bus 882. The particular components which are controlled by the microprocessor 880 over the bus 882 are the oscillator 850, the DC voltage source 710 and the amplitude control 740. The microprocessor 880 sets the frequency and the coarse amplitude of the oscillator 850 in accordance to information supplied by the keyboard 881. The microprocessor 880 then adjusts the precision DC voltage source 710 with output range 0.1 to 2.0 volts so that the desired amplitude of the AC voltage standard is available. The microprocessor 880 then provides proper gain selection to the amplitude control 740 so that the thermoelectric convertor 750 stays in its optimum operating range.

The initial control setting for the oscillator 850 and the DC voltage source 710 may be done by a remote source (not shown) over an IEEE-488 bus, thereby bypassing the manual operation of the keyboard 881 and enabling automatic operation.

Figure 8:
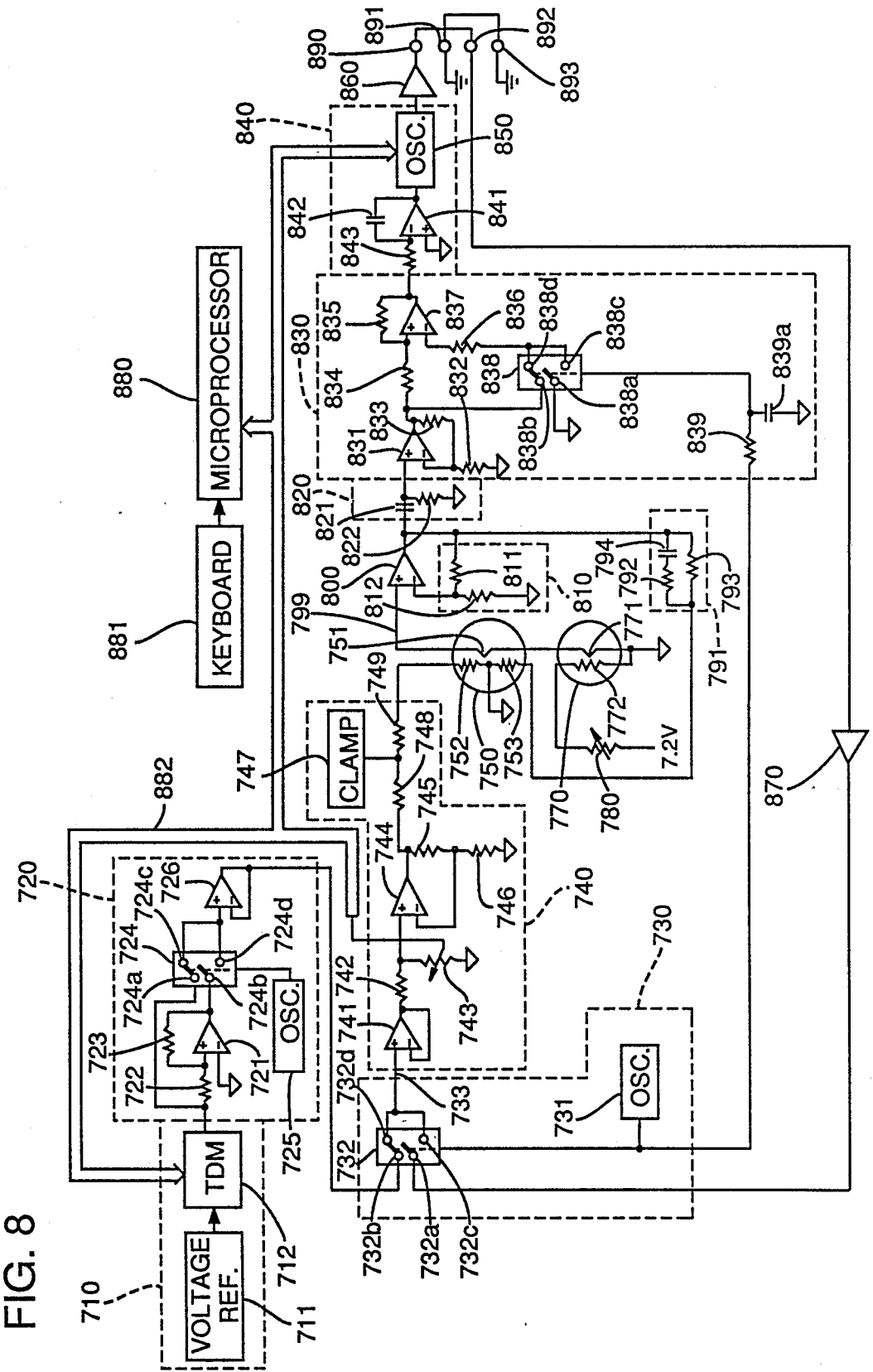
FIG. 8 is a more detailed, schematic block diagram of the FIG. 7 embodiment of our invention.

FIG. 8 shows the schematic diagram of the AC voltage standard embodiment of FIG. 7. The precision DC voltage source 710 consists of a precision 7.2 volt reference 711 and voltage scaler using a time division multiplexer (TDM) 712. The 7.2 volt reference 711 may be of the type LTD 1000 manufactured by Linear Technology. The 7.2 volt reference 711 outputs as precise voltage to the TDM 712, which produces 2.0 volts. The desired output range of 0.1 to 2.0 volts is generated by chopping the 2.0 volts, that is, turning the 2.0 volts on for a period of time and then turning the 2.0 volts off for a potentially different period of time. The result is then filtered to average the chopped 2.0 volts to obtain the desired output amplitude. As an example, if a 2.0 volt amplitude is desired, the 2.0 volts would be turned on for the entire period. If 1.0 volts is desired, the 2.0 volts would be turned on fifty per-cent of the period. This is done under microprocessor 880 control over the bus 882 with 32 bits to provide an output resolution of better than 1 ppm.

The square wave generator 820 generates a 500 Hz square wave with an amplitude plus or minus the voltage output of the voltage source 710. Therefore, in the present embodiment, the 500 Hz square wave has an amplitude of 0.1 to 2.0 volts. The square wave generator 820 consists of two operational amplifiers 721 and 726 with feedback circuits, a DPDT opto-FET switch 724 and a 500 Hz oscillator 725. The first operational amplifier 721 may be of the type 1052CN manufactured by Linear Technology or any of its equivalents. The output of the TDM 712 is connected through resistor 722 to the negative input of the amplifier 721, which in turn is connected to the output of the amplifier 721 through resistor 723, thereby causing the output of the TDM 712 to be inverted. Therefore in the present embodiment, the output of amplifier 721 is 0.1 to 2.0 volts. This output is then connected to an input terminal 724b of the DPDT opto-FET switch which may be of the type H11F2 manufactured by General Electric. The other input 724a is connected to the output of the voltage regulator 712. The output terminals 724c and 724d are connected together. The switch is constructed so that one of the poles 724b and 724d is normally closed and the other pole 724a and 724c is normally open as is shown. The switch is driven by a 500 Hz oscillator 725, which may be one half of a type timer 556 manufactured by National Semiconductor or any equivalent. When the 500 Hz oscillator is high, pole 724b and 724d is closed and pole 724a and 724c is open so that the $-2$ volts is on the output terminals, 724c and 724d, of the switch for this period. When the output of the 500Hz oscillator is low, poles 724b-d are opened and poles 724a-c are closed, $+2$ volts appears on the output terminals 724c and d for this period, forming a 500 Hz square wave with amplitude 2 volts. The output terminals 724c and 724d are then connected to the positive input of amplifier 726, which may be of the type OP-27 manufactured by PMI. The output of this amplifier 726 is connected to the negative input of the amplifier 726. In this configuration, amplifier 726 provides a gain of one. The output of the amplifier 726 is connected to the input of the multiplexer 730.

The multiplexer 730 consists of a DPDT CMOS RF switch 32, such as a type IN5341 manufactured by Intersil. It is driven by a 2Hz oscillator 731, which may be the other half of the type 556 timer manufactured by National Semiconductor. This switch 32 functions in the same manner as switch 724. Its outputs 732c and 732d are connected so that the output on wire 733 consists of 250 ms of the signal on input terminal 732b followed by 250 ms of the signal as input terminal 732a, thereby multiplexing the signals on the two inputs onto wire 733. Input terminal 732b is connected to the 500 Hz square wave reference signal which is generated by the square wave generator 720. The other input terminal 732a, is connected to the feedback of the AC voltage standard. In this way the reference signal and the AC voltage standard are multiplexed together onto wire 733.

The multiplexed signal on wire 733 is connected to the amplitude control circuit 740 which consists of a FET input buffer amplifier 741, an attenuation network 742 and 743, an operational amplifier 744, current limiting resistors 741 and 749, and a clamping circuit 747. The FET input amplifier comprises a dual FET, such as Siliconix 2N5564, followed by a Harris type 5195 op amp. It receives the multiplexed signal from the multiplexer 730 on its positive input terminal and has its output connected to its negative input terminal, so that it drives the multiplexed signal into the attenuation network 742 and 743 with a gain of one. The attenuation network 742 which consists of a resistor, which is in series with the output of the FET input amplifier 741 and the positive input of the amplifier 744, as well as a variable resistor 743 through which the positive input of the amplifier 744 is connected to ground. The variable resistor 743 is controlled by a microprocessor 880, which may be of type 68B02 manufactured by Motorola or any of the available microprocessors. These resistors, 742 and 743, provide a voltage divider network which the microprocessor 880 controls via wire 884 to provide a constant amplitude output of 0.9 to 1.0 volts from the amplitude control circuiting 740. The resistor values are adjusted by relays switching the appropriate resistance into the circuit. The relays are, in turn, driven by relay drivers which are controlled by signals over the bus 882 from the microprocessor 880.

The attenuated voltage from the attenuation network 742 is driven by an operational amplifier 744, which may be of type 5195 manufactured by Harris. The amplifier 44 has resistor 45 of 442 ohms connected between its output and negative input. 150 ohm resistor 746 connects its negative input to ground. The amplifier 744 drives the multiplexed signal through current limiting resistors 748 and 749, which are 422 ohms and 348 ohms respectively. These resistors protect the input of the first thermoelectric converter 750 which consists of a diode and active components. The output of the amplitude control circuit 740 is also held to a maximum of 2.1 volts by clamping circuit 747.

Alternatively to the method for gain switching by attenuation just described, the amplitude control circuit can be adjusted with direct control of gain by adjustment of feedback resistance and input resistance of the amplifiers under control of the microprocessor 880. The microprocessor 880 provides 5 bit signals over the bus 882 to relay drivers which control relays which switch desired resistors into the circuit. For example, the gain of the first of two amplifiers in the amplitude control can be adjusted by 10% by changing the value of a feedback resistor and can also be adjusted in steps of 1, 1.25, 1.5 and 1.82 by changing the value of an input resistor. The second amplifier can be adjusted similarly in steps of 1, 2, 4 and 8 by changing the values of an input resistor. Thus, a 20:1 range of gain can be provided under microprocessor control so that over the full range provided by the DC source 710, the input to the heater 752 of the electrothermal converter 750 will be within 10% of the same voltage, thereby maintaining its operating point at a relatively constant, high drive level.

The next stage comprises the thermoelectric converters 750 and 770. The first thermoelectric converter 750 is constructed with dual heater wires 752 and 753 and a sensor 751. This thermoelectric converter 750 forms the basis for making the comparison of the AC voltage standard and the reference square wave, as was previously discussed. The second thermoelectric converter 770 can be the same as converter 750 or can be constructed as shown with a single heater wire 772 and a sensor 771. The sensor 771 has polarized outputs so that when it generates a voltage one sensor terminal is more positive that the other. The negative terminal of sensor 771 is grounded and the positive terminal of sensor 771 is connected to the positive terminal of sensor 751 so that the output of the sensor 751 of the first thermoelectric converter 750 is biased by the voltage generated by sensor 771. While any biasing method may be used, the use of dual thermoelectric convertors 750 and 770 in a series bucking fashion affords the advantage of cancelling any environmental effect, such as temperature on the sensors 751 and 771. The sensor 771 in the second thermoelectric converter 770 generates a voltage in response to the RMS current in the heater wire 772. This heater wire 772 is driven by a positive 7.2 volt reference through 2000 to 2500 ohm variable resistor 780. The resistor is adjusted until sensor 771 outputs 4.5 mV, which is the biasing voltage, so that with no output from the sensor 751 from the first thermoelectric converter 750, the operating voltage at wire 799 would be 4.5 mV. However, this situation would not occur because the circuit is designed to function with a stable operating voltage on wire 799. This is the reason for the dual heater wire 752 and 756 construction of the first thermoelectric converter 750 and the feedback circuit driven by DC amplifier 800. The first heater wire 752 is driven by the multiplexed signal from the amplitude control circuitry 740, from which the sensor 751 will generate a voltage biased on the RMS current of the signal driving the first heater wire 752. Any voltage generated by the sensor 751 in response to the multiplexed signal will cancel the 4.5 mv biasing voltage from the second thermoelectric converter 770. If there is any voltage on wire 799 (i.e. if the sensor 751 does not generate 4.5 mV) the DC amplifier 800 will amplify the difference across its input terminals and cause a voltage to be on feedback wire 790.

This DC amplifier 800 consists of three stages of amplifiers, the first stage providing a gain of 4000, the second a gain of 25 and the third a gain of 10. The feedback wire 790 is connected to a network 791, which consists of a 8250 ohm resistor 793 in series with wire 790 and a series connection of a 348 ohm resistor 792 and a 3.3 uF capacitor 794, which is connected in parallel to resistor 793.

This network 791 speeds up the response by the first thermoelectric converter 750 by increasing the rise time of the error signal generated by D.C. amplifier 800. This network 791, in conjunction with the very high gain of DC amplifier 800, corrects for the slow response time of the thermoelectric converter 750. The output of network 791 drives the second heater wire 753 of the first thermoelectric converter 750 with the feedback current. The sensor 751 adjusts its output voltage so that the operating voltage on wire 799 reaches its stable point.

The DC amplifier 800 drives the high pass filter 820 with the feedback current which represents an error signal. The error signal measures the amount of RMS current required to drive the operating voltage on wire 799 to its stable point and therefore represents the RMS difference between the reference square wave and the AC voltage standard. The high pass filter 820 consists of a 1 microfarad capacitor 121 which is in series with the output of the DC amplifier 800 and a 100,000 ohm resistor 822 which is shunted to ground. This filter blocks the DC component of the error signal, which corresponds to the DC offsets and drifts from the electronic components, and allows the error signal from the AC voltage standard to pass. If the AC voltage standard is in balance with this reference square wave (their RMS content is equal) then the error signal at this point will be 0. If however the signals are unbalanced, then the error signal will consist of an AC voltage during the 250 ms the AC voltage reference is multiplexed in as well as when the 250 ms the reference signal is applied.

The output of the high pass filter 820 drives the demodulator 830 which consists of an amplifier 831 with a resistor feedback network 832 and 833, a DPDT switch 835, an RC network 839 and 839a, and a second amplifier 837. The first amplifier 831 receives the output of the high pass filter 820 in its positive input terminal and has a 200k ohm resistor 833 connecting its output to its negative input terminal. There is also a 21k ohm resistor 832 connecting its negative input terminal to ground. This amplifier 831 provides the drive for the rest of the circuitry which the high pass filter 820 could not. The output of the amplifier 831 is connected through a 10k ohm resistor 834 to the negative input of amplifier 837. The amplifier 837 may be of type OP-27 made by PMI. The negative input of amplifier 837 also has a feedback path from the output of amplifier 837 through 10k ohm resistor 835. The positive input of amplifier 837 is connected through a 5k ohm resistor 836 to both output terminals 838 and 838 of a DPDT switch 838. The output of amplifier 837 is connected to input 838b of DPDT switch 838. The other input 838a of DPDT switch B38 is grounded. The switch 838 is driven by oscillator 731, which drives CMOS DPDT switch 732 which forms the multiplexed input signal. The oscillator 731 output is connected to a lag network 791 consisting of 25k ohm resister 839 and one microfarad capacitor 839a, so that the demodulator switch 838 is switched approximately 25 ms after multiplexing switch 732. The lag network is required to account for signal delays through the components up to amplifier 837. When switch 838 closes contacts 838b and 838d, demodulator 830 amplifies the error signal. When switch 838 opens contacts 838b and 838d after 250 ms., it closes contacts 838a and 838c, so that the positive input to the amplifier 837 is grounded by resistor 836. In this embodiment, the demodulator 830 inverts the error signal. The result, at the output of the demodulator 830, is a pulsating DC signal representative of the AC error signal.

The output of the demodulator 830 drives an integrator 840. The integrator is the standard amplifier configuration, with an Amplifier 841 which may be of the type LT1012 made by Linear Technology with a resistor 843 in series with its negative input and its positive input grounded. There is a feedback capacitor 842 from the amplifier 841 output to its negative input terminal. This circuit provides a DC representation of the error signal and is used to adjust the AC voltage standard.

The oscillator 850 controls the amplitude of the voltage standard based on the DC output from the integrator. It has a frequency range of 10 Hz to 1 MHz. The output frequency and the coarse amplitude adjustments of the oscillator 850 are controlled by the microprocessor 880 over the bus 882. The output of the oscillator 850 feeds the buffer amplifier 860, which drives the output terminals for the AC voltage standard 890 and 891. The sense amplifier 890 picks up the AC voltage standard from the output terminals 892, 893 and provides the input to the multiplexer 730 by driving the input terminal 732a of the CMOS DPDT switch 732.

Figure 9:
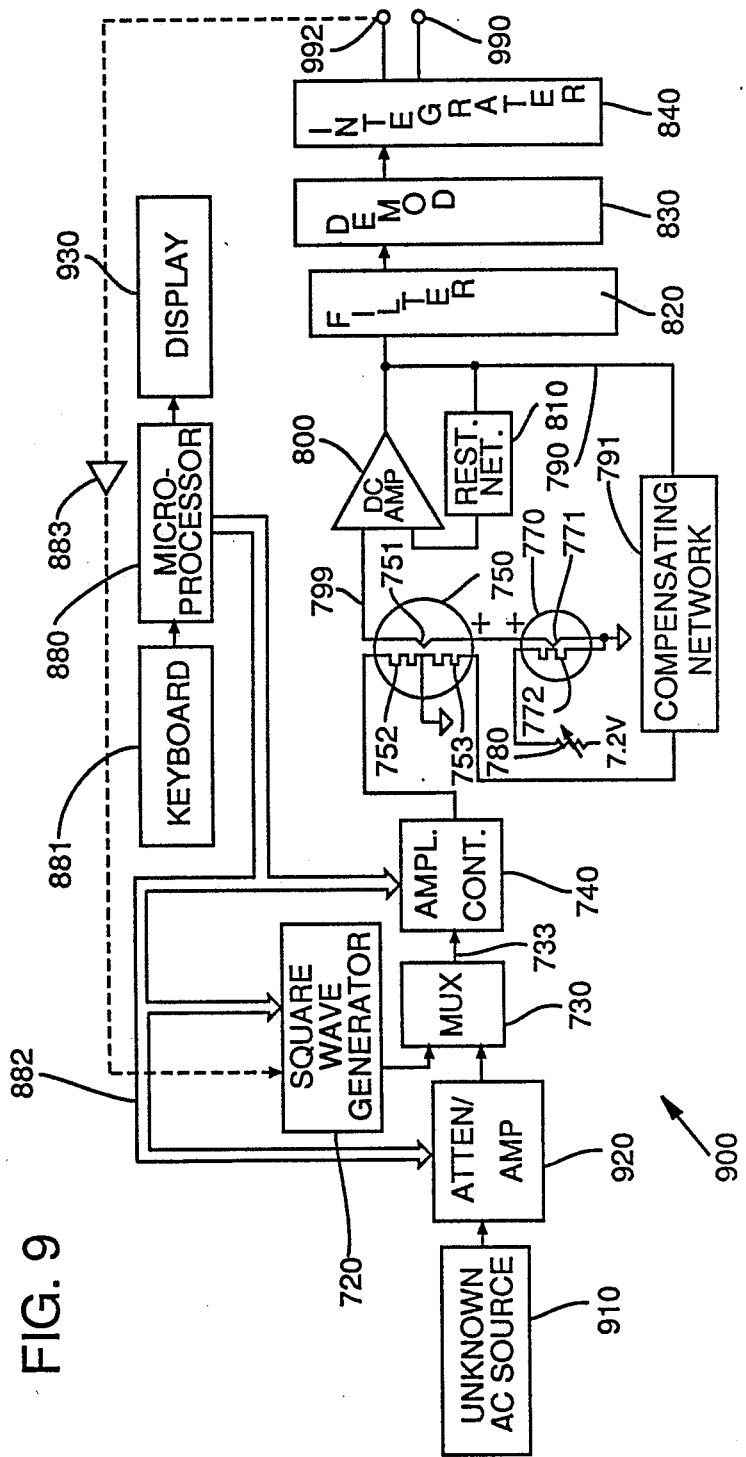
FIG. 9 is a block diagram of an AC voltmeter in accordance with our invention.

FIG. 9 is a block diagram of a second embodiment of my invention, incorporating most of the circuitry of FIGS. 7 and 8, to provide an accurate AC voltmeter 900. The multiplexer 730 receives a reference square wave generated by a DC source 840 and an AC signal source 910, as in the case of the AC calibration standard 700 of FIGS. 7 and 8, however, the source of these signals is different. The square wave generator 720 receives its input from the output of the circuit, the integrator 840, which functions as a DC source here. Hence the output of the circuit is fed back to generate the reference square wave of the multiplexed signal. The AC input source 910 provides an unknown signal whose RMS contact is to be measured. The circuit provides the identical function as previously discussed, however the output of FIG. 9 is from the integrator 840 and it represents the error information in the form of a DC signal. The error information tells us the difference between the reference square wave and the output of the unknown AC voltage source 910. This DC signal, representing the error in the reference square wave from the unknown AC voltage is fed back through buffer amplifier 880 to the square wave generator 720, so that a new reference square wave with a different amplitude can be generated. This continues until the reference square wave balances the AC signal from source 910. Once the balance has been reached, the output is a DC representation of the AC signal from source 910 and is available at output terminals 990, 991.

Figure 10:
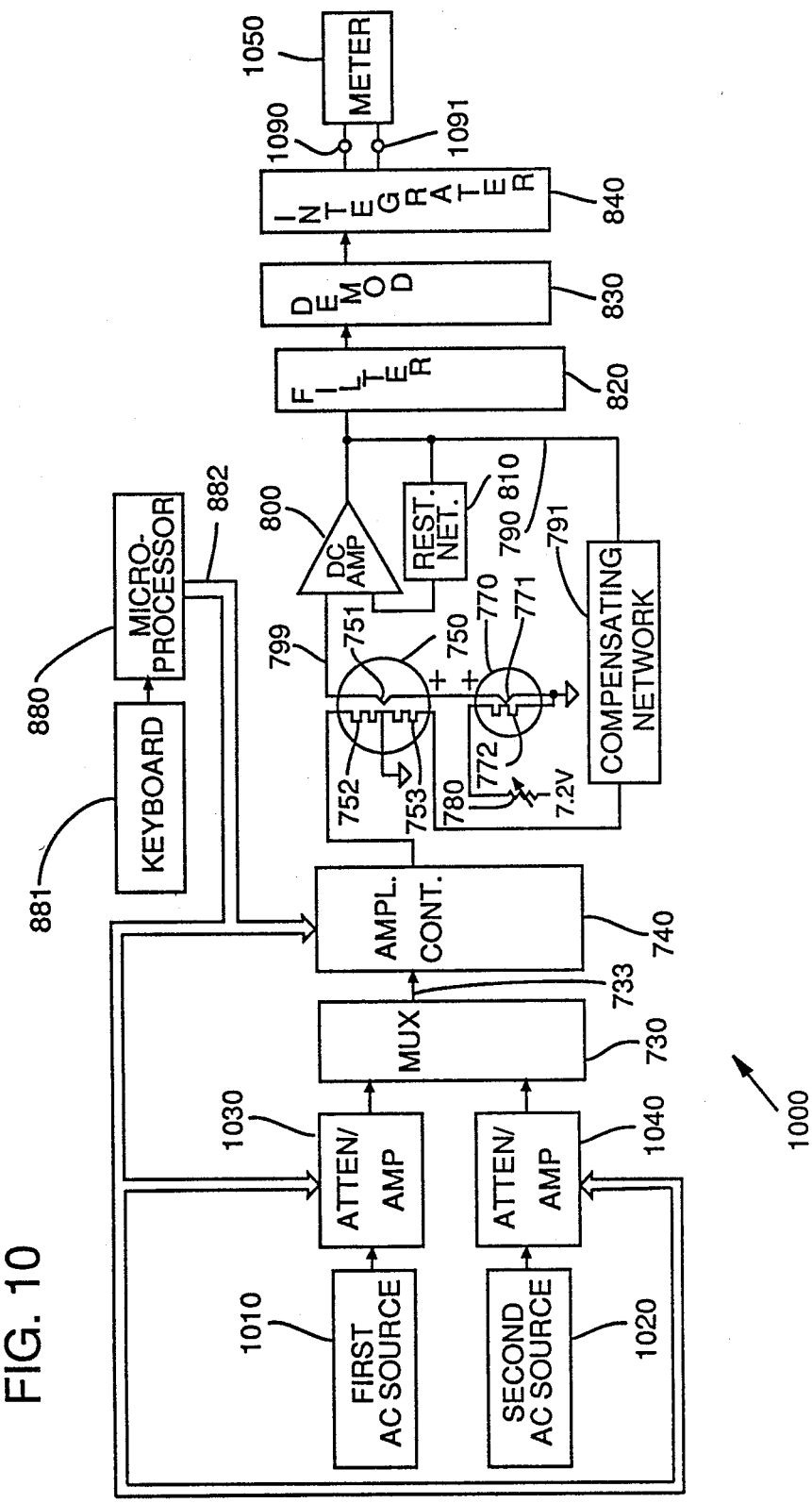
FIG. 10 is a block diagram of an AC signal comparator in accordance with our invention.

FIG. 10 is a block diagram of the third embodiment of my invention, wherein most of the same circuitry previously discussed generates a signal RMS comparator 1000. Thus, the unknown AC signals from sources 1010 and 1020 are applied to inputs of the multiplexer 730. The circuitry functions the same way as previously discussed and produces an error signal from the integrator 840, which is available at output terminals 1090, and 1091. This output is a DC representation of the error signal which is the RMS difference between the two unknown signals.

We claim:

1. Electrothermal conversion apparatus for generating a DC voltage related to the RMS value of an AC signal comprising:
   (a) first elongate means for generating thermal energy in response to a first signal;
   (b) second elongate means for generating thermal energy in response to a second signal;
   (c) said first and second means being in physical contact with one another over a substantial portion of their lengths, separated only by thermally conductive electrical insulation over the substantial portion of their lengths for which they are in physical contact, and forming a heater assembly; and
   (d) a temperature responsive electrical sensing means in physical contact with said heater assembly, said temperature responsive means producing a temperature-indicating electrical signal representative of the temperature of said heater assembly.

2. The apparatus of claim 1 wherein the first means and the second means each comprise a fine wire.

3. The apparatus of claim 2 wherein the temperature responsive means comprises a thermoresistive device connected to a source of current.

4. The apparatus of claim 3 wherein the thermoresistive device comprises a fine wire having a high thermal coefficient of resistivity which is in physical contact with the heater assembly over a substantial portion of its lengths.

5. The apparatus of claim 4 wherein the fine wires of the first and second means have a low thermal coefficient of resistivity.

6. The apparatus of claim 2 wherein the temperature responsive means comprises a thermocouple device.

7. The apparatus of claim 5 wherein the thermocouple device comprises a plurality of thermocouple junctions, each of which is in physical contact with the heater assembly.

8. The apparatus of claim 1 wherein the first and second elongate means are twisted together over the substantial portion of their lengths for which they are in physical contact.

9. Electrothermal conversion apparatus for generating a DC voltage related to the RMS value of an AC signal, comprising:
   (a) first means having a length for generating thermal energy in response to an AC signal;
   (b) second means having a length for generating thermal energy in response to a reference signal, the first and second means being twisted together over a portion of their lengths and being in thermal contact; and
   (c) a temperature responsive electrical sensing means in thermal contact with both the first and second means for producing thermal energy, the temperature responsive means producing a temperature-indicating electrical signal representative of the temperature produced by the first and second means.

10. The apparatus of claim 9 further comprising means for supplying a component of the temperature-indicating electrical signal to the second means as the reference signal.

11. The apparatus of claim 9 wherein the portion of the length of over which the first and second means are twisted together is a substantial portion.

* * * * *